US006556054B1

(12) United States Patent
Goodman et al.

(10) Patent No.: US 6,556,054 B1
(45) Date of Patent: Apr. 29, 2003

(54) EFFICIENT TRANSMITTERS FOR PHASE MODULATED SIGNALS

(75) Inventors: William L. Goodman, Los Altos Hills, CA (US); Mark Sweeny, Belmont, CA (US)

(73) Assignee: Gas Research Institute, Des Plaines, IL (US)

( * ) Notice: Subject to any disclaimer, the term of this patent is extended or adjusted under 35 U.S.C. 154(b) by 21 days.

(21) Appl. No.: 09/677,282

(22) Filed: Oct. 2, 2000

Related U.S. Application Data

(60) Provisional application No. 60/157,358, filed on Oct. 1, 1999.

(51) Int. Cl.⁷ .............................................. H03K 3/00
(52) U.S. Cl. ........................................ 327/110; 327/423
(58) Field of Search .......................... 327/108–112, 423, 327/587

(56) References Cited

U.S. PATENT DOCUMENTS

| 4,980,682 | A |   | 12/1990 | Klein et al. ................ 340/854 |
| 5,204,551 | A | * | 4/1993  | Bjornholt ................... 327/172 |
| 5,684,426 | A | * | 11/1997 | De Doncker ............... 327/440 |
| 5,912,930 | A |   | 6/1999  | Iwasaki ...................... 375/329 |

* cited by examiner

Primary Examiner—Kenneth B. Wells
(74) Attorney, Agent, or Firm—Mark E. Fejer

(57) ABSTRACT

A circuit for driving a current into an inductor, which circuit includes at least one main capacitor, a power supply operably connected to the main capacitor, the inductor, and at least two pairs of switches connecting the main capacitor to the inductor, whereby the connection of the main capacitor to the inductor is made in either polarity. Current is driven into the inductor by applying a current to the main capacitor, applying a voltage to the inductor from the main capacitor resulting in generation of inductive energy, and recapturing the inductive energy with the main capacitor at the end of a cycle.

14 Claims, 4 Drawing Sheets

EFFICIENT TRANSMITTERS FOR PHASE MODULATED SIGNALS

CROSS REFERENCE TO RELATED APPLICATION

This application claims the benefit of provisional U.S. patent application Ser. No. 60/157,358 filed Oct. 1, 1999.

BACKGROUND OF THE INVENTION

1. Field of the Invention

This invention relates to circuitry for driving an inductor, such as a magnetic antenna, which achieves phase modulation with only minimal losses of power needed to overcome losses in the inductor itself.

2. Description of Prior Art

When consideration is given to the roll of new technology in lowering the cost of finding and producing oil and gas, improvements in directional drilling are regularly recognized as one of the important driving factors. The number of successful applications of precisely directed and/or horizontally drilled wells for off shore development and in fractured or compartmentalized reservoirs has been growing rapidly over the past decade. However, if the potential benefits of directionally placed well bores are to be captured for a wider number of reservoirs, particularly those on shore and with more marginal economics, additional cost reduction in directional drilling technology is required.

One opportunity is to reduce the cost and increase the reliability of transmitting downhole sensor information to the surface, a key element of any directional drilling system. Presently, there are two methods of transmission and use: wireline steering tools and measurement-while-drilling (MWD) through mud pulse telemetry.

Wireline steering tools and MWD methods are used in the majority of holes drilled today. Wireline steering tools, which are considered to be the most reliable, transmit both data and power over a hard wired electrical connection between the downhole sensors and the surface. The disadvantages are related to the need for a wireline truck or skid and the necessity of using wet connections. Wet connects are required to access the sensor-stored information on a regular basis, but can be unreliable in certain situations, particularly when the enclosing fluid is highly conductive. There is also an accompanying increase in the number and cost of personnel required to operate these systems compared to an MWD system.

MWD systems rely on producing a positive or negative downhole pressure change in the fluid flowing through the drill pipe. The pulse amplitude at the surface is typically 100 to 200 pounds per square inch (psi) and is a pressure change above a static pressure that may be several thousand psi. There are also pressure variations introduced by the triplex mud pumps commonly in use. MWD systems are by nature slow, with bit rates of less than 1 bit per second (bps), and for reliable operation, fluid flow must be controlled tightly. If there are lost circulation problems, the MWD system usually fails to perform. Some MWD systems work well in vertical holes but fail in horizontal applications.

The ideal downhole data transmission system would be portable, easy to operate, reliable over a wide range of situations, and relatively low cost. One possible contender for this spot would be an electric dipole system. This approach is based upon applying a voltage difference between two sections of isolated drillstring.

Because a typical drillstring might be 100 times the length of the dipole end sections, physics determines that each volt applied by the transmitter should result in a microvolt at the receiver. In fact, the received signal is even stronger because the transmitter is not really a dipole but has a long conducting element (the drillstring), leading all the way to the surface.

Unfortunately, the received signal is much weaker and can become undetectable when conducting upper layers short out the signal. In addition, such a system will not operate inside a cased hole for the same reason. These factors make the electric dipole less attractive as an alternative transmission system.

Phase modulation is widely used in the communication industry, and it has long been known that 180 degree phase shifts are optimal for transmission of a string of 1's and 0's. Typically, an "exciter" is used to generate a low level phase modulated signal, which is then amplified by means of a power amplifier. Resonant circuits are often used, as the signal bandwidth is usually small compared to the carrier frequency. This approach works well for high frequency signals where the signal bandwidth is small compared to the signal frequency. This conventional approach is also intended to drive resistive loads, such as a tuned antenna, which do not store energy. Due to the fact that power amplifiers are generally on the order of about 50% efficient, the efficiency of this approach is relatively low.

SUMMARY OF THE INVENTION

A magnetic field could be used to transmit information from downhole sensors if a magnetic dipole is located above the bit and the magnetic field is detected at the surface. Such a system would overcome the disadvantages of an electric dipole system, while potentially providing cost and reliability benefits over existing systems.

This application, theoretically operable bi-directionally and over distances of several kilometers, could be configured so that the transmitter would be controlled from the surface to conserve power. A combination battery/downhole power generator would add to the running time and enable higher output power levels.

The choice of transmission frequency of such a system would need to be a compromise between the need to keep the frequency low (in the 10 Hz range) to avoid the excitation of eddy currents in the formation, and the need to avoid the low frequency noise background of the earth's magnetic field. The best approach to creating a large dipole downhole, would be to use a 10 meter drillpipe section as a support for the antenna. This section would be positioned at the bottom of the drill string above the steering sensors and the antenna would be excited by a large coil wrapped around the antenna section. Protection for the coil would be provided by an overall outer cover.

There are three special problems to be dealt with in the operation of a low frequency magnetic antenna: (1) the stored inductive energy in the antenna is very large and efficient operation is only possible if this energy is captured and reused; (2) the transmitted signal bandwidth is of the same order of magnitude as the frequency carrier, and simple resident circuits will not work; and (3) the frequency of this signal must be very tightly controlled, usually requiring that it be locked to a crystal oscillator. In addition to these problems, the electronics used for borehole telemetry must often operate at high temperature where the ability to dissipate heat is severely limited.

Accordingly, it one object of this invention to provide a magnetic transmission system which operates with minimal power consumption, that is, the achievement of phase modulation with only the minimal losses of power needed to overcome losses in the antenna itself.

It is another object of this invention to provide a magnetic transmission system which addresses the three special problems set forth hereinabove.

It is yet another object of this invention to provide a circuit which offers the possibility of much lower power dissipation than is possible by means of conventional circuitry.

It is another object of this invention to provide a circuit which captures the energy stored in the inductive load and reuses it in the next cycle instead of dissipating it.

These and other objects of this invention are addressed by a circuit for driving a current into an inductor, such as a magnetic antenna, comprising at least one main capacitor, a power supply operatively connected to the at least one main capacitor, the inductor, and at least two pairs of switches connecting the at least one main capacitor to the inductor, whereby the connection of the at least one main capacitor to the inductor is made in either polarity.

In accordance with the method for driving a current into an inductor in accordance with this invention, a current is applied to the main capacitor and a voltage is applied to the inductor from the main capacitor resulting in generation of inductive energy. At the end of a cycle, the inductive energy is recaptured by the main capacitor.

BRIEF DESCRIPTION OF THE DRAWINGS

These and other objects and features of this invention will be better understood from the following detailed description taken in conjunction with the drawings wherein.

DESCRIPTION OF PREFERRED EMBODIMENTS

The circuits of this invention drive current into a magnetic antenna by means of a voltage applied by a capacitor. The capacitor is also used to recapture the inductive energy at the end of the cycle. This is similar to the way a resident "LC" operates. Unlike a simple "LC" circuit, the capacitor is connected to the antenna by means of a set of switches. The switches allow the capacitor to be connected to the antenna in either polarity, or to be completely disconnected from the antenna. The possibility to completely disconnect the antenna from the capacitor, when the current is 0, allows the control circuitry to control the signal period very precisely by varying the length of the time during which the capacitor is disconnected from the antenna. In some implementations, the antenna can be "shorted", that is the ends connected together, so that the period of high current can be prolonged instead of, or in addition to, the period of no current. Power is supplied to the circuit by applying a current to the capacitor. The switches are controlled by a microcontroller which measures currents and voltages in the circuit and uses this data to decide when to open and close the switches.

Figure 1:
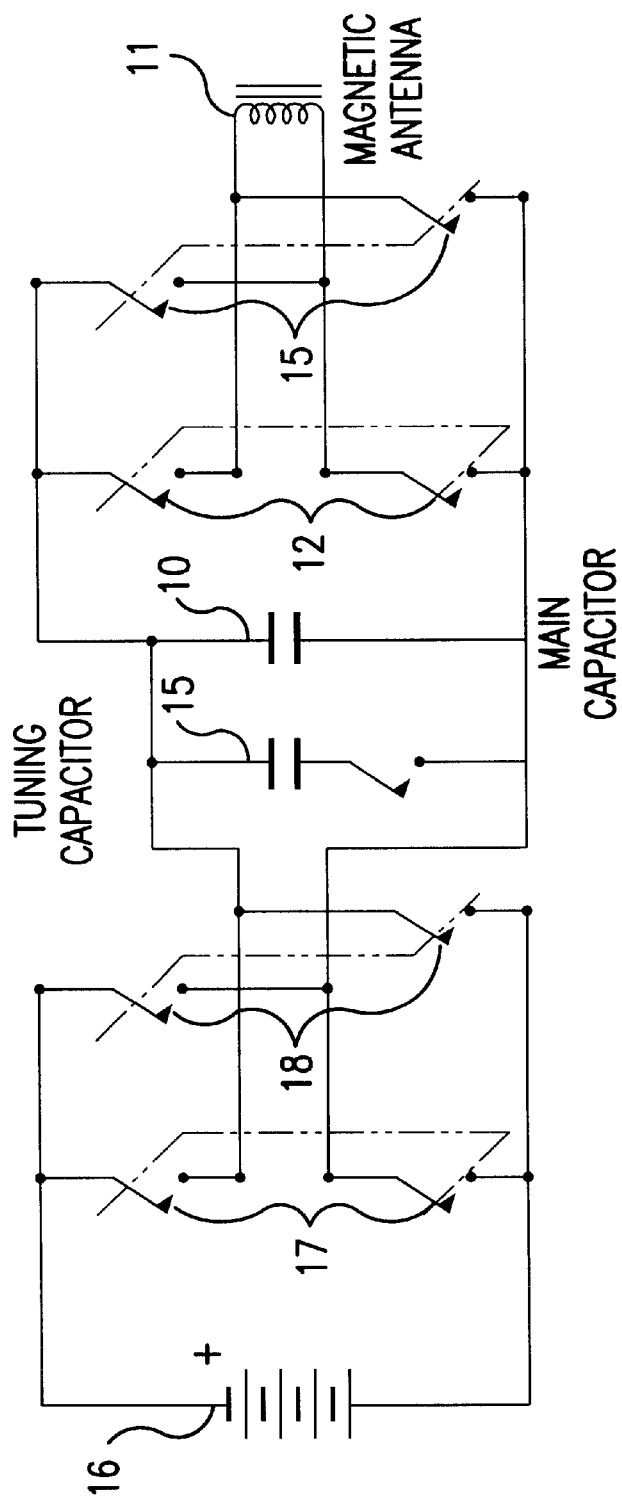
FIG. 1 is a schematic diagram of a modulator circuit in accordance with one embodiment of this invention.
Figure 2:
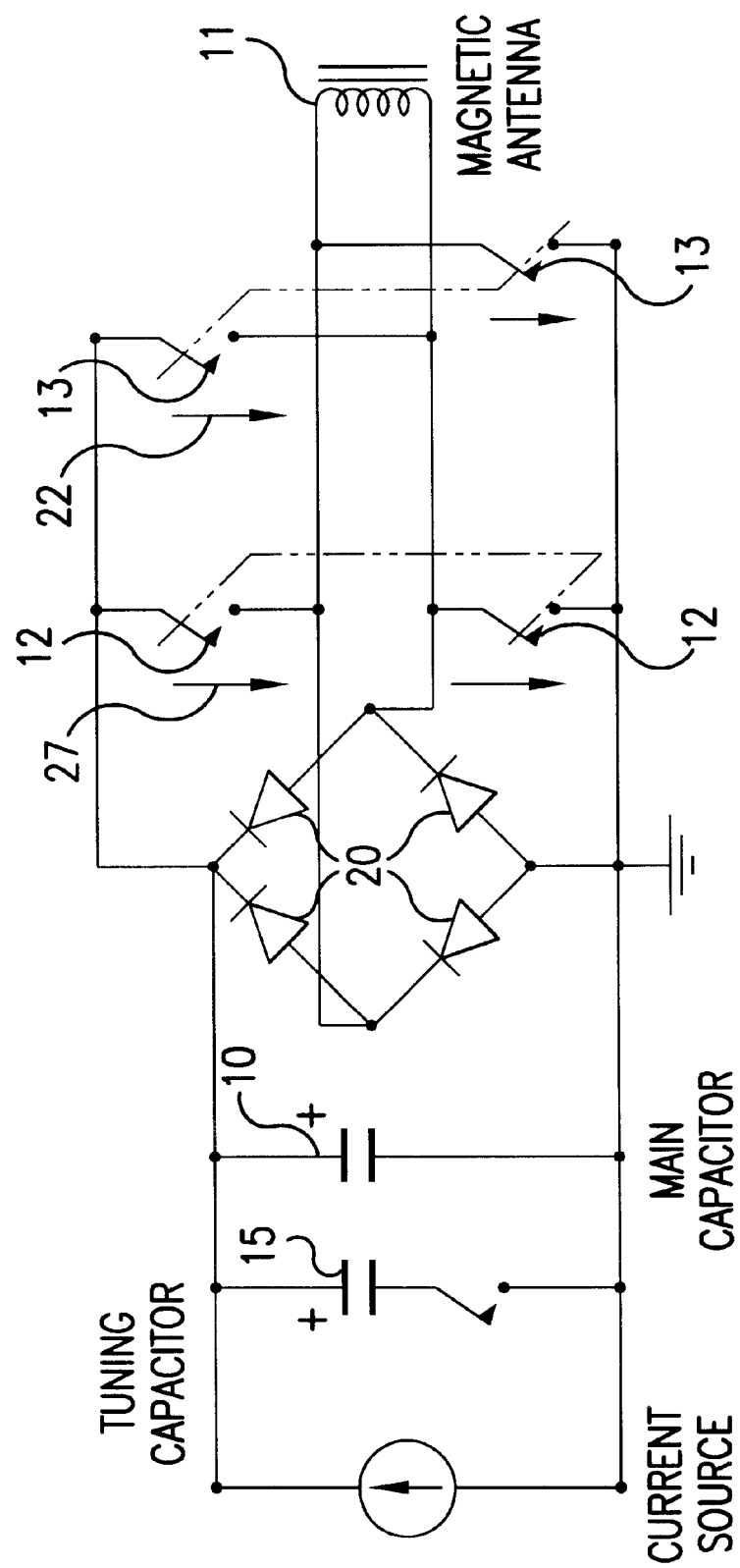
FIG. 2 is a schematic diagram of a modulator circuit in accordance with another embodiment of this invention.

FIGS. 1 and 2 show the major components of the circuit of this invention in accordance with preferred embodiments.

For both embodiments, a set of four switches is used to connect the capacitor to the antenna, which is shown as an inductor. The circuit shown in FIG. 1 is more straight forward and is easy to implement using isolated bipolar switches, that is switches which are able to block or pass a current in either direction. The embodiment shown in FIG. 2 is intended to be used with unipolar switches. As power MOS devices are the most likely devices to be used as switches, and these devices are unipolar, the embodiment of FIG. 2 will usually be the circuit of choice.

FIG. 1 shows a circuit in accordance with one embodiment of this invention comprising main capacitor 10 connected to inductor 11 by means of two pairs of switches 12 and 13, which can make the connection in any polarity. The main capacitor 10 is connected to battery 16 by two pairs of switches 17 and 18 which allow for main capacitor 10 to be charged in any polarity. In accordance with one embodiment, a tuning capacitor 15 is connected in parallel with main capacitor 10 and can be switched in or out of the circuit. Tuning capacitor 15 is used to tune the LC combination for more optimal performance. The dashed lines indicate pairs of switches that are opened or closed in pairs.

FIG. 2 shows a modular circuit in accordance with an alternative embodiment of this invention. In addition to main capacitor 10 and switch pairs 12 and 13, the circuit in accordance with this embodiment comprises at least one diode connected between the main capacitor 10 and magnetic antenna 11. As in the embodiment of FIG. 1, main capacitor 10 can be connected to magnetic antenna 11 in either polarity, but when the energy is to be transferred from magnetic antenna 11 back to main capacitor 10, diodes 20 always charge main capacitor 10 in the same polarity. If switches 12 and 13 are left open after the magnetic antenna current reaches its maximum, the current will remain in magnetic antenna 11 and continue to flow subject only to resistive losses. This will prolong the high current portion of the period. As shown, power is applied to the system by applying a current source to main capacitor 10. In accordance with one embodiment, tuning capacitor 15 is connected in parallel with main capacitor 10 between the current source and main capacitor 10. As in the embodiment of FIG. 1, the dashed lines indicate pairs of switches that are opened or closed in pairs, which pairs are identified by numerals 12 and 13. This circuit can be used with bipolar switches and arrows 21 and 22 indicate the direction of current flow in the switches.

To operate the circuit shown in FIG. 1, main capacitor 10 must be connected for a one-half cycle after which it will carry a charge opposite the initial charge. After being connected for one-half cycle, the current in magnetic antenna 11 will be 0 and main capacitor 10 can be disconnected for an arbitrary period of time. As the charge in main capacitor 10 alternates, the circuit of FIG. 1 requires that another set of two pairs of switches 17, 18 be used to connect the DC power source 16 to main capacitor 10 in either polarity. This charges main capacitor 10 to make up for losses in the circuit. The switches shown in FIG. 1 are always switched in pairs as illustrated.

Figure 3:
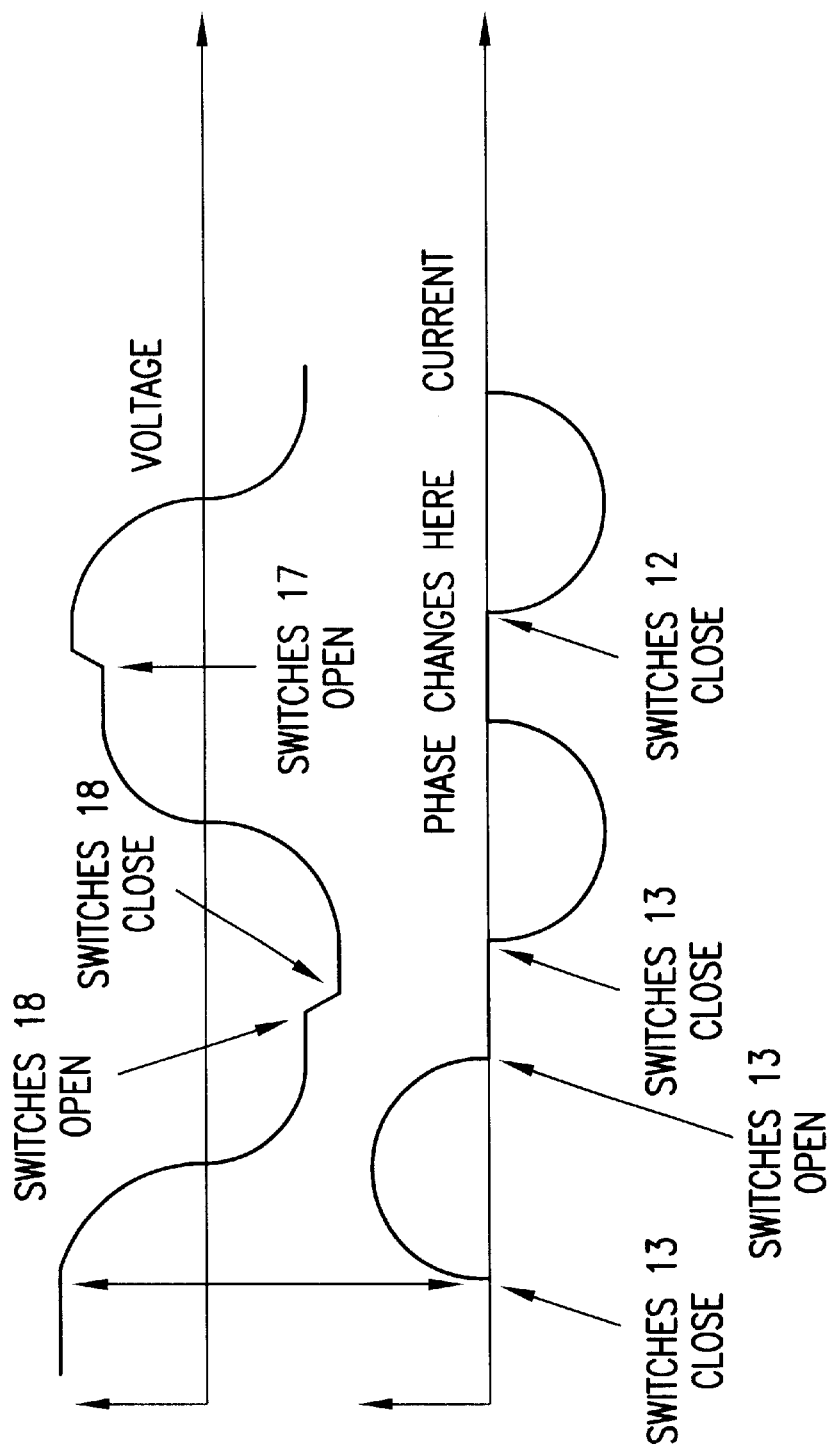
FIG. 3 is diagram of the waveforms of antenna current and capacity voltage generated by the modulator circuit of FIG. 1.

FIG. 3 illustrates the operation of the circuit shown in FIG. 1. The top curve corresponds to the capacitor voltage while the bottom curve corresponds to the antenna current. As can be seen, there is a 180 degree phase change indicated in the current waveform. This phase is changed during the 0 current portion of the cycle. As can also be seen, the capacitor voltage is best recharged during the 0 current times. The length of the dwell time at 0 current can be varied to maintain the frequency precisely at the desired value. The arrows indicate points in time at which the switches are opened or closed.

In the case of the circuit shown in FIG. 2, the current in the magnetic antenna 11 is returned to main capacitor 10 by means of a set of diodes 20, and main capacitor 10 is always charged with the same polarity. As main capacitor 10 is unipolar, the charging circuit can also be unipolar. In fact, the charging circuit could even be a constant current source. The charging current is chosen to maximize efficiency and to optimize the signal waveform. The circuit of FIG. 2 is chosen to allow the use of power FET switches, which already have parasitic diodes that take the form shown in the diode bridge. Another advantage of this circuit is that it allows the high current portion of the signal waveform to be prolonged, which gives rise to a larger effective signal. As in the circuit of FIG. 1, the switches connecting main capacitor 10 to magnetic antenna 11 are switched in pairs.

Figure 4:
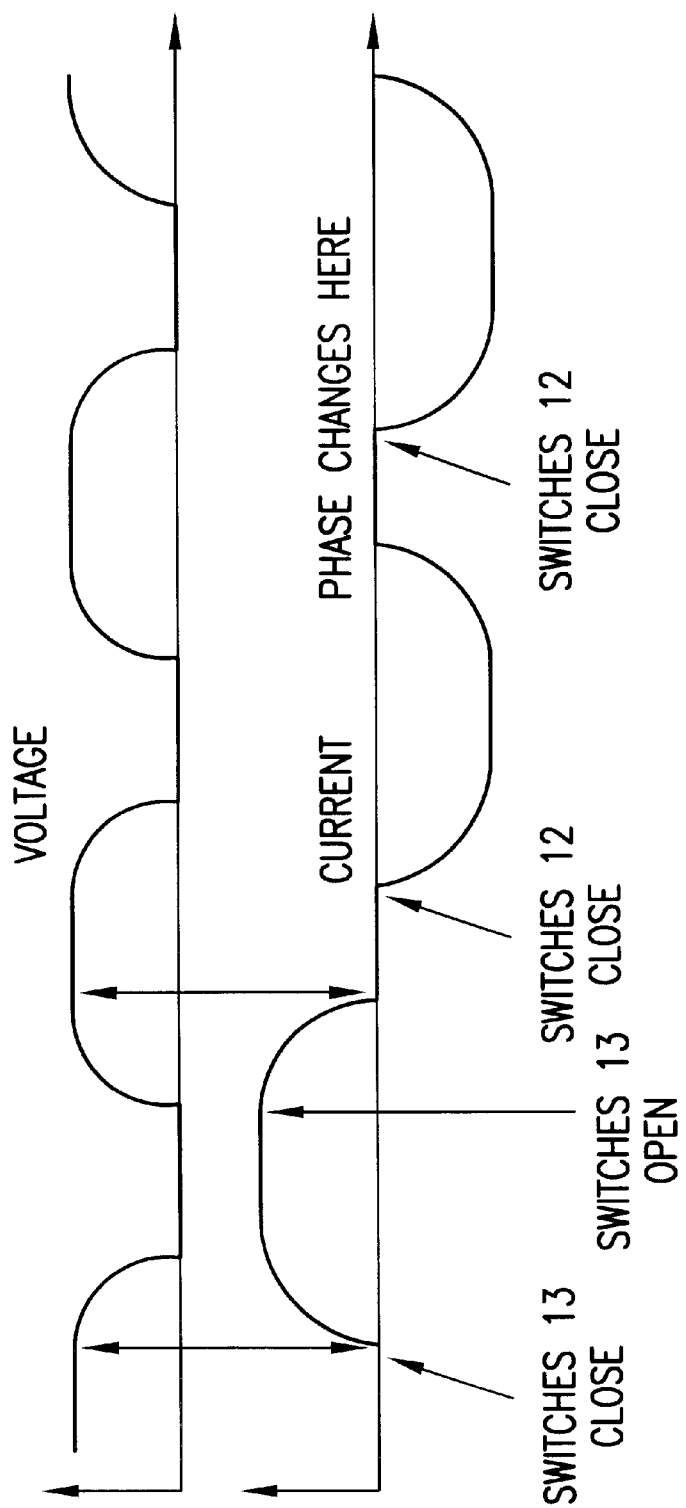
FIG. 4 is a diagram of the waveforms of antenna current and capacity voltage generated by the modulator circuit of FIG. 2.

FIG. 4 illustrates the operation of the circuits shown in FIG. 2. The top curve corresponds to capacitor voltage and the bottom curve corresponds to the antenna current. As before, there is a 180 degree phase change indicated in the current waveform. The phase is changed during the 0 current portion of the cycle. The dwell time at 0 current corresponds to the case of the capacitor being fully charged and the switches all closed. The dwell time at 0 current corresponds to the case of the capacitor being fully charged and the switches all closed. The dwell time at maximum current corresponds to the capacitor being fully discharged and at least one pair of switches open. Both of these dwell times can be prolonged by an arbitrary length of time.

In circuits of both FIGS. 1 and 2, the capacitor can be varied by means of switching tuning capacitors 15 in or out. The ability to tune the capacitors allows the output signal strength to be optimized and to be adjusted for situations that change the antenna inductive. Use of the antenna inside casing, for example, will change the inductance.

EXAMPLE

A one-quarter scale antenna with transmitter circuitry as described herein was built and tested. The antenna was measured to dipole moment of 1000 $Am^2$, which is nearly the same value measured with a sinusoidal drive current of 1 A peak. The antenna assembly was tested by lowering it into an existing well, which was cased. The signal strengths and bit error rates are shown in Table 1. The uncased results were calculated on the assumption of a 1000 $Am^2$ dipole moment. Signal strengths are all peak values. The maximal test depth was limited by the depth of the well, and, as can be seen in the table, the bit error rate observed was very low even at the bottom of the well. As can be seen, the signal strength can be expected to be several times stronger in an uncased well.

TABLE 1

Signal Strengths and Bit Error Rates

| Depth (ft.) | Signal Strength (measured) (pT) | Signal Strength Without Casing (pT) | Error Rate |
|---|---|---|---|
| 1260 | 1.05 | 2.57 | 0.5% |
| 1112 | 1.4 | 4.0 | 1% |
| 964 | 2.2 | 6.5 | 0.3% |
| 815 | 4.0 | 11.2 | 0.3% |

Note that the signal strengths are the sum of two sensors.

While in the foregoing specification this invention has been described in relation to certain preferred embodiments thereof, and many details have been set forth for purpose of illustration, it will be apparent to those skilled in the art that the invention is susceptible to additional embodiments and that certain of the details described herein can be varied considerably without departing from the basic principles of the invention.

We claim:

1. A circuit for driving a current into an inductor comprising:
   at least one main capacitor;
   a power supply operably connected to said at least one main capacitor;
   said inductor; and
   at least two pairs of switches connecting said at least one main capacitor to said inductor whereby the connection of said at least one capacitor to said inductor is made in either polarity, each of said switches having an open position and a closed position.

2. A circuit in accordance with claim 1 further comprising at least one tuning capacitor connected in parallel to said at least one main capacitor between said at least one main capacitor and said power supply.

3. A circuit in accordance with claim 2 further comprising switching means for switching said at least one tuning capacitor in and out of said circuit.

4. A circuit in accordance with claim 1, wherein said switches are MOS-FETs.

5. A circuit in accordance with claim 3, wherein said switching means comprises at least two pairs of tuning capacitor switches connecting said power supply to said main capacitor and said tuning capacitor in either polarity.

6. A circuit in accordance with claim 1 further comprising at least one diode connected between said at least two pairs of switches and said at least one main capacitor whereby said at least one diode always charges said at least one main capacitor in a same polarity.

7. A circuit in accordance with claim 1, wherein said at least two pairs of switches are bipolar.

8. A circuit in accordance with claim 1, wherein said at least two pairs of switches are unipolar.

9. A circuit in accordance with claim 1, wherein said inductor is a magnetic antenna.

10. A method for driving a current into an inductor comprising the steps of:
    applying a current to a main capacitor;
    applying a voltage to said inductor from said main capacitor resulting in generation of inductive energy; and
    recapturing said inductive energy with said main capacitor at an end of a cycle, wherein said current and said voltage are measured by a microprocessor which, based upon said measurements, determines when to open and close two pairs of switches connecting said main capacitor to said inductor.

11. A method in accordance with claim 10, wherein said inductor is disconnected from said main capacitor when said current is zero.

12. A method in accordance with claim 11, wherein a length of time during which said inductor is disconnected from said main capacitor is variable.

13. A method in accordance with claim 10, wherein a period of high current is prolonged by shorting said inductor.

14. A method in accordance with claim 10, wherein said inductor is a magnetic antenna.

* * * * *